United States Patent
Pomet et al.

[11] Patent Number: 5,978,295
[45] Date of Patent: Nov. 2, 1999

[54] SEQUENTIAL ACCESS MEMORIES

[75] Inventors: Alain Pomet, Rousset; Bernard Plessier, Aix en Provence, both of France

[73] Assignee: STMicroelectronics S.A., Gentilly, France

[21] Appl. No.: 09/106,941

[22] Filed: Jun. 30, 1998

[30] Foreign Application Priority Data

Jul. 4, 1997 [FR] France .................................. 97 08517

[51] Int. Cl.⁶ .................................................. G11C 19/00
[52] U.S. Cl. ............................ 365/221; 365/78; 365/240
[58] Field of Search .................................. 365/78, 189.12, 365/221, 239, 240

[56] References Cited

U.S. PATENT DOCUMENTS

| | | | |
|---|---|---|---|
| 4,935,902 | 6/1990 | Tatsuki | 365/239 |
| 4,969,126 | 11/1990 | Maeno | 365/240 |
| 5,025,419 | 6/1991 | Nishino | 365/221 |
| 5,291,457 | 3/1994 | Asato et al. | 365/239 |
| 5,295,174 | 3/1994 | Shimizu | 377/76 |

FOREIGN PATENT DOCUMENTS

| | | | |
|---|---|---|---|
| 0645 775 A1 | 3/1995 | France | G11C 19/00 |
| 2 183 374 | 6/1987 | United Kingdom | G11C 19/28 |

*Primary Examiner*—Son Mai
*Attorney, Agent, or Firm*—Allen, Dyer, Doppelt, Milbrath & Gilchrist

[57] ABSTRACT

A sequential access memory comprises N register elements each storing an information bit. These N register elements are divided into P groups each comprising L elements. In a first phase of operation whose duration corresponds to P−1 consecutive periods of the clock signal, only the last elements of each group are activated and are furthermore series-connected. In a second phase of operation whose duration corresponds to a single period of the clock signal, all the elements are activated simultaneously, the groups of elements being furthermore series-connected. The advantage is that it enables a reduction in the dynamic consumption of the memory.

16 Claims, 4 Drawing Sheets

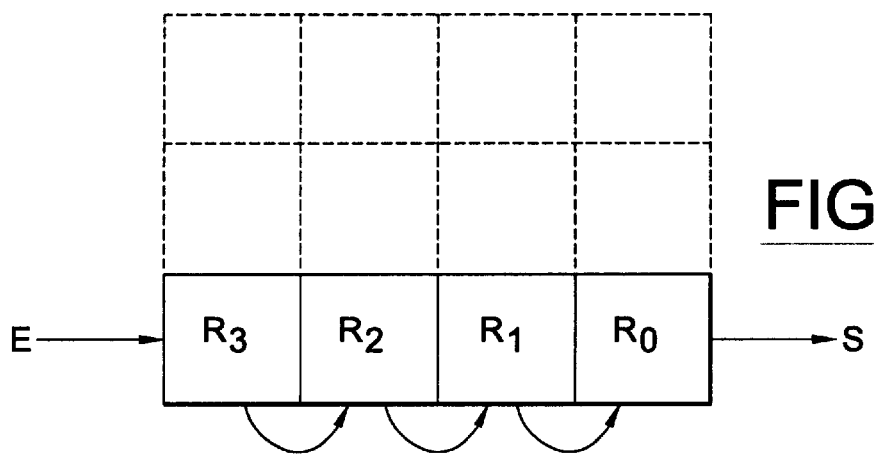
FIG. 4.
FIG. 5.
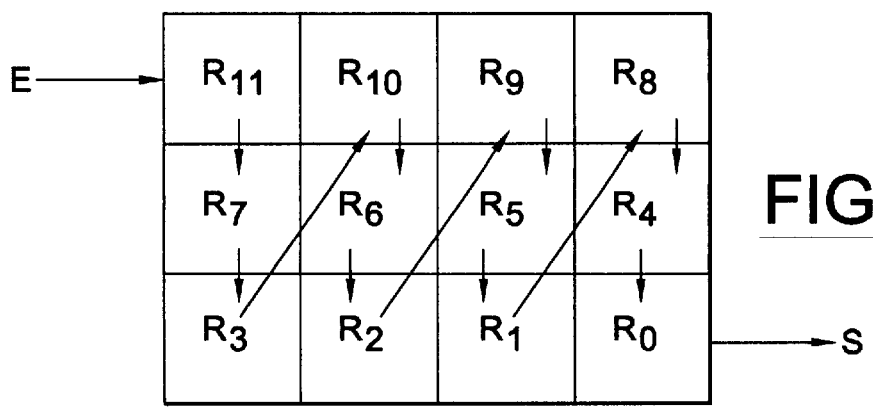
FIG. 6.

|    | t0  | t1  | t2  | t3  | t4  | t5  | t6  | t7  | t8  | t9  | t10 | t11 | t12 |
|----|-----|-----|-----|-----|-----|-----|-----|-----|-----|-----|-----|-----|-----|
| R0 | s0  | s1  | s2  | s3  | s4  | s5  | s6  | s7  | s8  | s9  | s10 | s11 | e0  |
| R1 | s1  | s2  | s3  | e0  | s5  | s6  | s7  | e4  | s9  | s10 | s11 | e8  | e1  |
| R2 | s2  | s3  | e0  | e1  | s6  | s7  | e4  | e5  | s10 | s11 | e8  | e9  | e2  |
| R3 | s3  | e0  | e1  | e2  | s7  | e4  | e5  | e6  | s11 | e8  | e9  | e10 | e3  |
| R4 | s4  | s5  | s6  | s7  | s8  | s9  | s10 | s11 | e0  | e0  | e0  | e0  | e4  |
| R5 | s5  | s6  | s7  | s8  | s9  | s10 | s11 | e0  | e1  | e1  | e1  | e1  | e5  |
| R6 | s6  | s7  | s8  | s9  | s10 | s11 | e0  | e1  | e2  | e2  | e2  | e2  | e6  |
| R7 | s7  | s8  | s9  | s10 | s11 | e0  | e1  | e2  | e3  | e3  | e3  | e3  | e7  |
| R8 | s8  | s9  | s10 | s11 | e0  | e1  | e2  | e3  | e4  | e4  | e4  | e4  | e8  |
| R9 | s9  | s10 | s11 | e0  | e1  | e2  | e3  | e4  | e5  | e5  | e5  | e5  | e9  |
| R10| s10 | s11 | e0  | e1  | e2  | e3  | e4  | e5  | e6  | e6  | e6  | e6  | e10 |
| R11| s11 | e0  | e1  | e2  | e3  | e4  | e5  | e6  | e7  | e7  | e7  | e7  | e11 |
| S  | s0  | s1  | s2  | s3  | s4  | s5  | s6  | s7  | s8  | s9  | s10 | s11 | e0  |
| E  | e0  | e1  | e2  | e3  | e4  | e5  | e6  | e7  | e8  | e9  | e10 | e11 | e12 |

FIG. 7d. Select

SEQUENTIAL ACCESS MEMORIES

FIELD OF THE INVENTION

The present invention relates to memories, and, more particularly, to an improvement in a sequential access memory that can be applied especially to the storage of data on chip cards.

BACKGROUND OF THE INVENTION

A memory is said to be a sequential access memory when the information bits arrive in serial form, at the input of a memory register, and are delivered at the output of this memory register also in serial form with a certain delay, and in the order of their input (which is why they are called "first-in-first-out" or FIFO memories). FIG. 1 shows a known embodiment of a memory of this kind. This memory comprises N series-connected register elements. These N register elements are, for example, D type flip-flop circuits (also called copying flip-flop circuits), such as the flip-flop circuit 11. They are bistable and synchronous flip-flop circuits. By the term "bistable", it is understood that the Q output of the flip-flop circuit may take two different stable logic states (the high state and the low state).

The expression "synchronous" means that the output of the flip-flop circuit can change its state only when a signal edge, for example, a leading edge, is applied to a clock input CP of the flip-flop circuit. It will then be said that the flip-flop circuit is activated. The logic state of the D input is then copied at the Q output and held until the appearance of a new edge on the input CP, irrespective of changes undergone by the signal at the D input between these two edges.

The serial connection of the D flip-flop circuit is such that the Q output of a particular flip-flop circuit is transmitted to the D input of the next flip-flop circuit. For example, the memory register 1 of the prior art structure shown in FIG. 1 has twelve D flip-flop circuits that are thus series-connected. Each simultaneously receives a clock signal CK at its clock input CP. The data bits that appear successively at the input E of the register provided by the D input of the first flip-flop circuit 12 are successively transmitted from one flip-flop circuit to another at the rate of the leading edges of the clock signal. They are finally delivered to the output of the last flip-flop circuit 13 after the twelfth pulse of the clock signal. The output of the flip-flop circuit 13 is the output of the memory register.

If necessary, in a manner that is also known, the output of the register is looped to its input through a data routing means so as to obtain the circulation of the data in the serpentine route provided by the thus-looped register. Thus, the loss of information is prevented. The register then necessarily has a number of flip-flop circuits at least equal to the number of data bits to be memorized, and is preferably equal to this number.

FIG. 2 shows a schematic view of the register 1 of FIG. 1, showing the twelve elements of the register R0 to R11 provided by the D flip-flop circuits of FIG. 1. The arrows between the register elements represent the transmission of the data bits from one element to another. This transmission is done at the rate of the leading edges of the clock signal CK applied simultaneously to all the elements.

The major drawback of this known sequential access memory architecture lies in its very high dynamic consumption of current. Indeed, a full write cycle for writing an N bit word in a register that comprises N register elements requires N clock periods during which the N registers are activated simultaneously. If e denotes the elementary energy consumed by a register element owing to its activation by an edge of the clock signal (the term used will be its "dynamic consumption" as opposed to its "static consumption" during the holding phases that elapse between two successive activation operations), then a value of dynamic energy equal to $ED=N \times N \times e$ is consumed by the register.

This energy consumption is detrimental for two reasons. Firstly, the energy consumed by the register gives rise to a heating of the electronic circuit that incorporates it. The heat generated needs to be dissipated outwards. This is a factor that hampers the present development towards very large-scale integration.

Secondly, this consumption of current discharges the accumulator that supplies the circuit for its operation. This is especially detrimental when the circuit is used by a portable apparatus that is self-supplied or remote-supplied by inductive coupling.

SUMMARY OF THE INVENTION

It is therefore an object of the present invention to overcome the drawbacks of the prior art mentioned hereabove. Indeed, the invention is directed to a sequential access memory working at the rate of a clock signal CK and comprising N bistable and synchronous register elements, each storing an information bit. The N elements are divided into P groups each comprising L elements. A management unit makes the memory work in such a way that, in a first phase of operation whose duration corresponds to P–1 consecutive periods of the clock signal, it is only the last elements of each group that are activated simultaneously and are furthermore series-connected. The input of the first of these elements then provides the input of the memory and the output of the last element then provides the output of the memory.

In a second phase of operation whose duration corresponds to a single period of the clock signal, all the elements are activated simultaneously. The groups of elements are furthermore series-connected. The input of the first element of the first group then provides the input of the memory, and the output of the last element of the last group then provides the output of the memory.

It can be shown that, through the invention, the maximum and mean dynamic consumption of the memory is significantly reduced as compared with that of prior art memories. Indeed, it can be seen that, according to the invention, certain memory elements are activated only during the second phase of operation which is very short, and, therefore, does not substantially contribute to the dynamic consumption of the memory.

BRIEF DESCRIPTION OF THE DRAWINGS

Other features and advantages of the invention shall appear from the following description. This description is given purely by way of an illustration and must be read with reference to the appended drawings, of which:

FIG. 4 shows a schematic view of the register of the memory of FIG. 3;

FIG. 5 shows a schematic view of this register during the first phase of operation;

FIG. 6 shows a schematic view of this register during the second phase of operation;

FIGS. 7a to 7d show timing diagrams of signals of operation of the memory according to the invention.

DETAILED DESCRIPTION OF THE PREFERRED EMBODIMENTS

Figure 3:
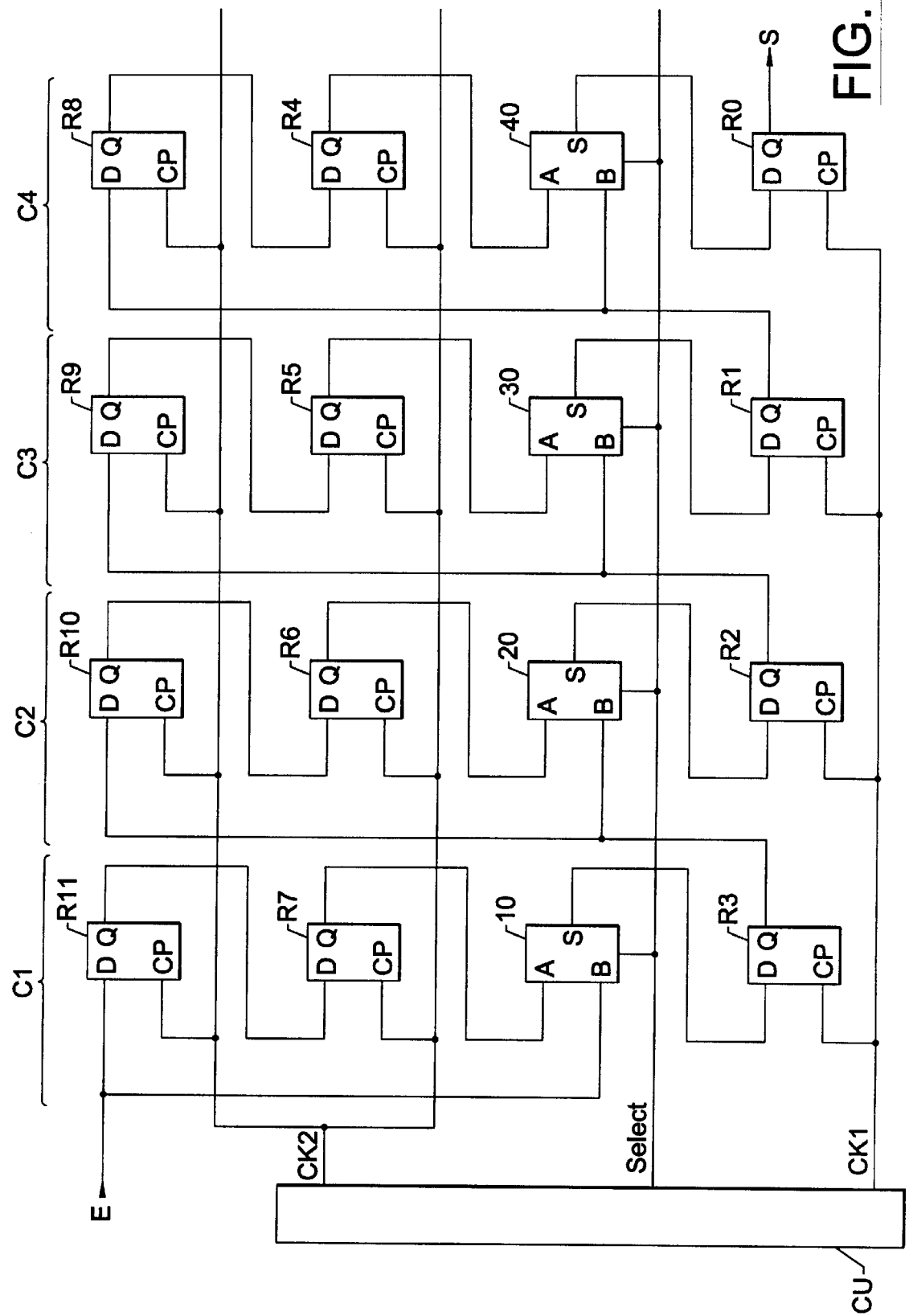
FIG. 3 shows an exemplary embodiment of a memory according to the invention.

FIG. 3 shows an exemplary embodiment of the invention in the case of a memory register comprising twelve register elements, such as, for example, D flip-flop circuits divided according to the invention into four groups C1 to C4, each comprising three flip-flop circuits. It is clear that the principle of the invention can be extended to a memory register comprising N elements divided into P groups of L elements each, with N=L×P.

The first group of flip-flop circuits C1, therefore, comprises three flip-flop circuits R11, R7 and R3 that are series-connected. More specifically, the two outputs of the flip-flop circuit R11 are connected to the D input of the flip-flop circuit R7 whose Q output is itself transmitted to a first input A of a two-input (or two-channel) multiplexer 10. The multiplexer 10 also has its output connected to the D input of the third flip-flop circuit R3 and has a second input B connected to the input E of the register.

The second group of flip-flop circuits C2 comprises three flip-flop circuits R10, R6 and R2 that are series-connected. The Q output of the third flip-flop circuit R3 of the first group is connected to the D input of the first flip-flop circuit R10 of the second group C2 whose Q output is connected to the D input of the second flip-flop circuit R6 of the group C2. The Q output of the flip-flop circuit R6 is itself connected to a first input A of a two-input (or two-channel) multiplexer 20 whose output S is connected to the D input of the third flip-flop circuit R2 of the group C2. A second input B of the multiplexer 20 is also connected to the Q output of the third flip-flop circuit R3 of the first group C1.

The third group of flip-flop circuits C3 also comprises three flip-flop circuits R9, R5 and R1. The Q output of the third flip-flop circuit R2 of the second group C2 is connected to the D input of the first flip-flop circuit R9 of the third group C3. The Q output of the flip-flop circuit R9 is connected to the D input of the second flip-flop circuit R5 of the group. The Q output of the flip-flop circuit R5 is connected to a first input A of a two-input (or two-channel) multiplexer 30 whose output S is connected to the D input of the third flip-flop circuit R1 of the group C3. The Q output of the third flip-flop circuit R2 of the second group C2 is also connected to a second input B of the multiplexer 30.

The fourth group C4 finally has the three flip-flop circuits R8, R4 and R0 which are series-connected. The Q output of the third flip-flop circuit R2 of the group C3 is connected to the D input of the first flip-flop circuit R8 of the fourth group C4. The Q output of the first flip-flop circuit R8 is connected to the D input of the second flip-flop circuit R4 of the fourth group. The Q output of the flip-flop circuit R4 is connected to a first input A of a two-input (or two-channel) multiplexer 40 whose output S is connected to the D input of the third flip-flop circuit R0 of the group C4. The Q output of the third flip-flop circuit R1 of the third group C3 is also connected to a second input B of the multiplexer 40. The Q output of the third flip-flop circuit R0 of the fourth group C4 is connected to the output S of the register of the memory.

A third input of each of the multiplexers 10, 20, 30 and 40 simultaneously receives one and the same selection signal SELECT. The clock inputs CP of the last flip-flop circuits R3, R2, R1 and R0 of each of the four groups C1, C2, C3 and C4 simultaneously receive a first activation signal CK1. The clock inputs CP of the first flip-flop circuits R11, R10, R9 and R8 and of the second flip-flop circuits R7, R6, R5 and R4 of each group C1, C2, C3 and C4 simultaneously receive a second activation signal CK2.

The memory according to the invention can be represented diagrammatically in the form of a matrix with four columns and three rows as can be seen in FIG. 4. Each register element R0 to R11 defining the register of the memory is formed by the flip-flop circuits of FIG. 3 bearing the same references. It can thus be seen that, schematically, a given group of flip-flop circuits C1, C2, C3 or C4 corresponds to a column of the matrix of FIG. 4.

The working of the memory shall now be described with reference to FIGS. 5 to 8. FIG. 7a shows a clock signal CK of the electronic circuit incorporating the memory according to the invention. This signal is periodic with a period 1/f. It is in the high state during the first half of the period and in the low state for the rest of the time, so that it has a leading edge at the beginning of the period. The leading edges of this signal CK occur at instants referenced t0 to t13.

FIG. 7b shows the first activation signal CK1 which, as can be seen, is identical with the clock signal CK. FIG. 7c shows the second activation signal CK2 which is also a periodic signal. However, the first signal CK1 has leading edges at the instants t1 to t12 while the second signal CK2 has edges of this kind only at the instants t4, t8 and t2. FIG. 7d finally shows a selection signal SELECT which is in the high state between the instants t3 and t4, as well as between the instants t7 and t8 and between the instants t11 and t12, and is in the low state for the rest of the time.

The activation signals CK1, CK2 and the selection signal SELECT are generated by a management unit CU (FIG. 3) essentially comprising a counter modulo 4 (modulo P in general) which may be complemented by elementary logic gates. This counter modulo P is advantageously made by means of X D-type flip-flop circuits mounted in a T assembly (i.e. flip-flop circuits having their complementary outputs Q connected to the D input so that the output changes its state at each edge that arrives at its clock input CP). Accordingly, X=$\log_2 P$ is an integer, and the Q output of a given flip-flop circuit other than the last one is connected to the D input of the next flip-flop circuit. This is why it will preferably be chosen to have a memory structure in which P is an integer power of two (namely $\log_2 P = X$, with X as an integer).

Figure 8:
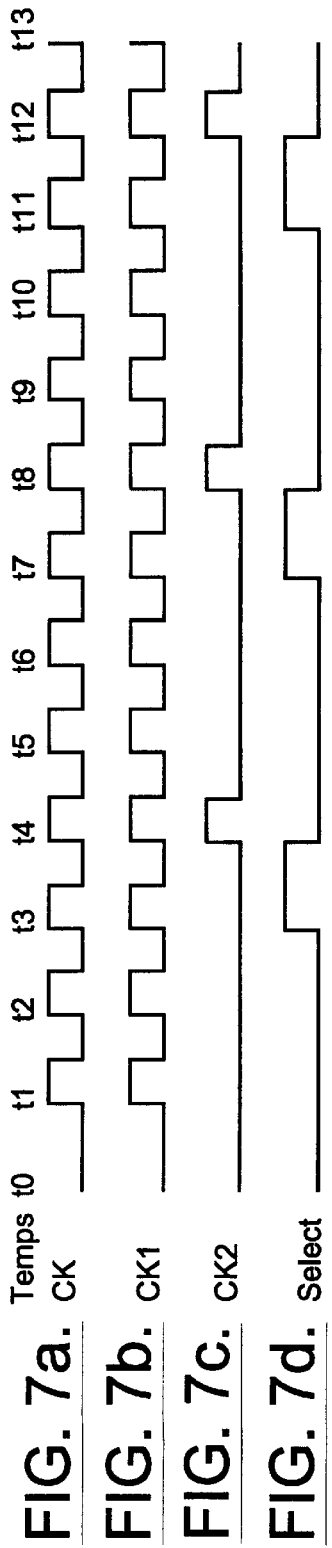
FIG. 8 is a table showing the state of the register of FIG. 4 in the course of time.

The table of FIG. 8 shows the state of the register elements R0 to R11 of the memory at each instant t0 to t12, as well as the state of the output S and of the input E of the memory at these instants. The references S0 to S11 are assigned to the variables symbolizing the state of the registers R0 to R11 respectively at the initial instant t0 (these are outgoing variables). The references E to E12 are also assigned to the variables representing the logic state of the data bits that arrive successively at the input E of the memory register at each instant t1 to t12 respectively (these are incoming variables).

As will have been understood, the reading of the table of FIG. 8 makes it possible to follow the development of the state of the register elements R0 to R11 between the instants to and t12. The working of the memory takes place in two distinct phases which are defined by the state of the signal SELECT applied simultaneously to the third input of each of the multiplexers 10, 20, 30 and 40 (FIG. 3). In other words, the multiplexers are controlled by the signal SELECT to make the memory work alternately in the first phase of operation and in the second phase of operation.

The passage of the signal SELECT from the low state to the high state is prompted by the leading edge of the clock signal CK which occurs at the instant t3. The passage of the signal SELECT from the high state to the low state is determined by the leading edge of the clock signal CK which occurs at the instant t4. The first phase of operation is defined by a signal SELECT in the low state, while the second phase of operation is determined by a signal SELECT in the high state.

In the first phase of operation, the signal transmitted to the output of the multiplexers 10, 20, 30 and 40 is the signal carried to the second input B of the multiplexers. In the second phase of operation, this signal transmitted to the output of the multiplexers 10, 20, 30 and 40 will be the signal carried to their first input A.

Thus, the working of the memory during the first phase of operation may be summarized by the diagrammatic representation of FIG. 5 showing the register elements R3, R2, R1 and R0 which alone are activated during the operating phase by the leading edges of the first activation signal CK1. In FIG. 5, the registers R4 to R11 which are not activated during the first phase of operation are shown in dashes. The register of the memory then behaves like a shift register comprising the series-connected register elements R3, R2, R1, R0, the input E of the memory being the input of the register element R3 and the output S being the output of the register element R0. The information bits arriving at the input E are propagated from one register element to the other at the rate of the leading edges of the first activation signal CK1 of FIG. 7b which occur at the instants t1, t2 and t3. Thus, the duration of the first phase of operation corresponds to three consecutive periods of the clock signal CK (namely P-1 consecutive periods of the signal CK in the general case).

As stated further above, the leading edge of the clock signal CK occurring at the instant t3 prompts the passage of the signal SELECT from the low state to the high state. The signal at the output of each of the multiplexers 10, 20, 30 and 40 is then the signal present at the first input A. The output of the second flip-flop circuit R7, R6, R5 and R4 of each group C1, C2, C3 and C4 is then connected to the input of the third flip-flop circuit R3, R2, R1 and R0 of the groups through the multiplexers. Everything happens as if the twelve flip-flop circuits of the memory register R11, R7, R3, R10, R6, R2, R9, R5, R1, R8, R4, R0 were series-connected.

In other words, everything happens as if the four groups of flip-flop circuits C1, C2, C3 and C4 were series-connected. The Q output of the last flip-flop circuit of a given group (other than the last C4) is connected to the D input of the first flip-flop circuit of the next group. The working of the memory at the instant t4 when a leading edge occurs on the clock signal CK, as well as on the second activation signal CK2 can then be shown schematically as can be seen in FIG. 6. The input E of the memory register is then identified with the input of the first register element R11 and the output S of the register is identified with the output of the register R0. At the instant t4, the transfer of the bits to the interior of a register element can then be summarized as follows:

for each group Ci other than the last group C4, the contents of a given register element other than the last register element of the group is transmitted to the following register element in the group;

the contents of the last register element of the above groups is transmitted to the first register element of the next group $C_{i+1}$; and the contents of the last element of the register R0 of the last group C4 is lost; conversely, the information bit present at the input E of the register is then saved in the first register element R11 of the first group C1. In FIG. 6, these events are represented by means of arrows.

The role of the multiplexers 10, 20, 30 and 40 controlled by the selection signal SELECT is to select a route for the information bits arriving at the input E of the register in combination with the activation signals CK1 and CK2 and with the selection signal SELECT. The choice of a two-input multiplexer is conditioned by the simplicity of this approach, given that it is also possible to envisage the use of combinational circuits of greater complexity using a certain number of logic gates. There are thus existing variants of flip-flop circuits where a multiplexer is integrated into the flip-flop circuit. The use of these flip-flop circuits is possible here, but does not change the functionality of the circuit.

As can be seen, the multiplexers are controlled by the management unit CU to make the memory function alternately in the first phase and then the second phase of operation. An iteration of these two phases makes it possible to store P information bits. This storage operation must be repeated L times to store N bits arriving in series at the input E of the memory.

The working of the memory according to the invention, such as it has just been described, is absolutely transparent if we consider the circulation of data elements between the input E and the output S of the memory. Indeed, if we leave aside what happens within the memory between these two points, the memory according to the invention works in the manner of the prior art sequential access memories. In particular, the writing and reading in the memory take place at the rate of the clock signal CK (namely at the frequency f). The memory according to the invention can therefore easily be used in circuits that use prior art memories, and this can be done with the same performance in terms of read and write speeds as in the prior art. However, only the last P register elements R3, R2, R1 and R0 of each group C1, C2, C3 and C4 are activated at each leading edge of the clock signal CK. The N-P other register elements are activated only once on P periods of the clock signal CK, giving L times on N periods of the clock signal CK.

It can be shown that consumption by the memory according to the invention is therefore significantly reduced as compared with the consumption by similar memories according to the prior art. Thus, if we again calculate the dynamic energy ED' consumed by the memory according to the invention for the writing of an N bit word in the N register elements, we get:

$$ED'=e{\times}P{\times}N+e{\times}(N-P){\times}L$$

giving, with P=N/L, $$ED'=e{\times}N^2/L+e{\times}(N-N/L){\times}L$$

$$ED=e{\times}N^2{\times}(1/L+L/N-1/N)$$

$$ED'=ED{\times}(1/L+L/N-1/N)$$

It can be easily seen that for the high values of N, the dynamic energy ED' consumed by the memory according to the invention is reduced by a factor on the order of L as compared with the energy ED consumed by a comparable memory of the prior art. This is significant given that, in practice, the memories generally comprise several thousands of register elements.

Figures 1, 2:
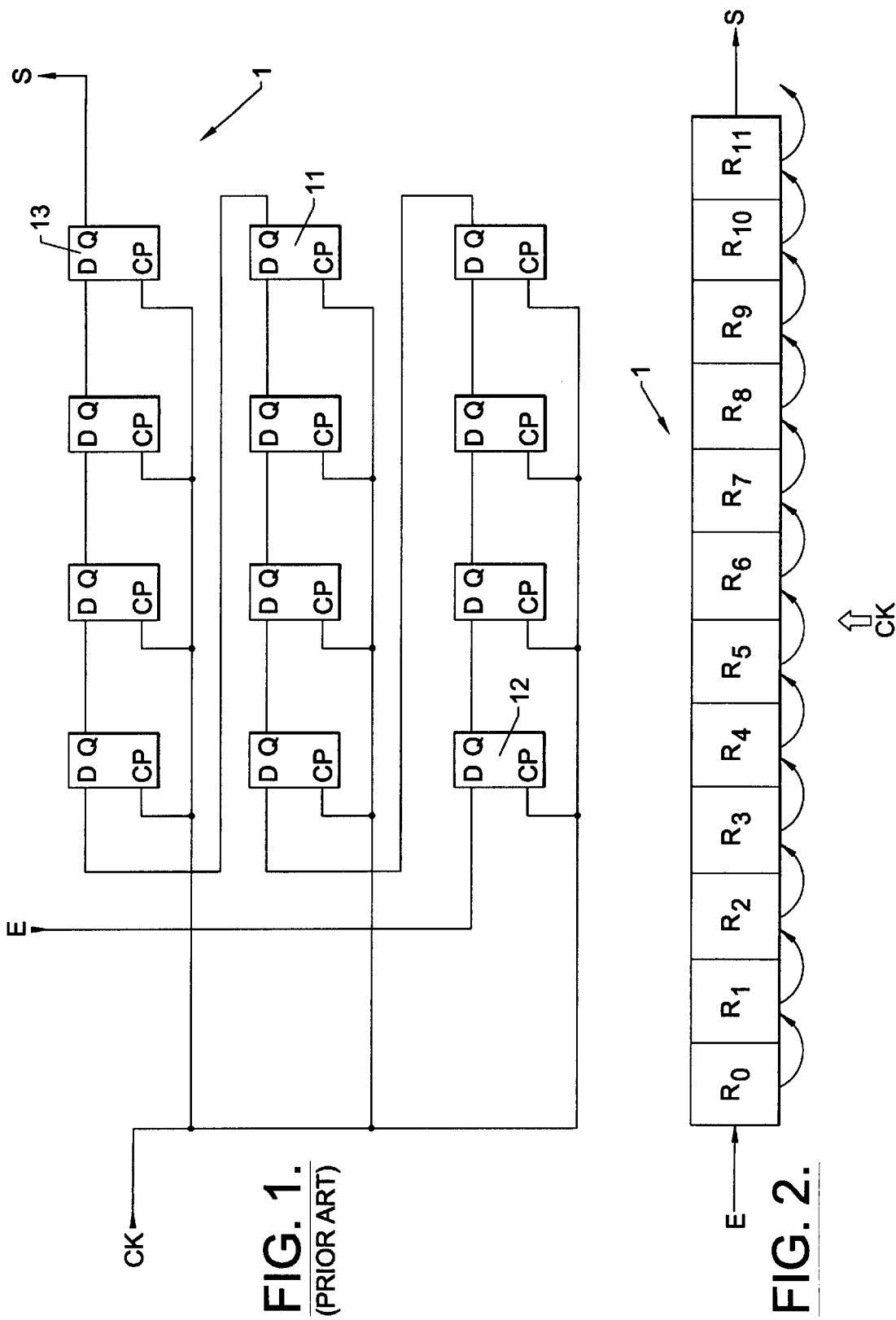
FIGS. 1 and 2 which have already been described respectively show a known memory structure of the prior art as well as a schematic view of the register architecture of the present invention.

In the above computations, the contribution of the means for generating the operating signals CK1, CK2 and the SELECT signal have been overlooked. This contribution is negligible for the high values of N. CK1 is always active and is equivalent to the signal CK of FIG. 1.

That which is claimed is:

1. A sequential access memory working at a rate of a clock signal and comprising:

N bistable and synchronous register elements, each storing an information bit, the N elements being divided into P groups each comprising L elements; and a management unit for causing the elements to operate as follows in a first phase of operation whose duration corresponds to P–1 consecutive periods of the clock signal, only last elements of each group are activated simultaneously and are furthermore series-connected, an input of a first of these elements then defining an input of the memory and an output of a last element then defining an output of the memory, and in a second phase of operation whose duration corresponds to a single period of the clock signal, all the elements are activated, the groups of elements being furthermore series-connected, the input of the first element of the first group then defining the input of the memory, and the output of the last element of the last group then defining the output of the memory.

2. A memory according to claim 1, further comprising selection means operatively connected between an output of a second-to-last element and an input of the last element of each group.

3. A memory according to claim 2, wherein said selection means is controlled by the management unit for making the memory operate alternately in the first phase of operation and in the second phase of operation.

4. A memory according to claim 3, wherein said selection means comprises:

a first input connected to the output of the second-to-last element of the group concerned;

a second input which, for a first group of elements, receives the data elements entering the memory which are furthermore transmitted to the input of the first element of the group and, for the other groups, is connected to the output of the last element of the previous group, this output being furthermore connected to the input of the first element of the group concerned; and an output connected to the input of the last element of the group concerned, the state of said output being equal either to the state of said first input or to the state of said second input as a function of the state of a third input.

5. A memory according to claim 2, wherein said selection means comprises at least one two-channel multiplexer.

6. A sequential access memory comprising:

N bistable and synchronous register elements, each storing an information bit, the N elements being divided into P groups each comprising L elements;

a management unit for causing the elements to operate as follows in a first phase of operation whose duration corresponds to P–1 consecutive periods of a clock signal, only last elements of each group are activated simultaneously and are furthermore series-connected, an input of a first of these elements then defining an input of the memory and an output of a last element then defining an output of the memory, and in a second phase of operation whose duration corresponds to a single period of the clock signal, all the elements are activated, the groups of elements being furthermore series-connected, the input of the first element of the first group then defining the input of the memory, and the output of the last element of the last group then defining the output of the memory; and a selection circuit cooperating with said management unit for making the memory operate alternately in the first phase of operation and in the second phase of operation.

7. A memory according to claim 6, wherein said selection circuit is operatively connected between an output of a second-to-last element and an input of the last element of each group.

8. A memory according to claim 7, wherein said selection circuit comprises:

a first input connected to the output of the second-to-last element of the group concerned;

a second input which, for a first group of elements, receives the data elements entering the memory which are furthermore transmitted to the input of the first element of the group and, for the other groups, is connected to the output of the last element of the previous group, this output being furthermore connected to the input of the first element of the group concerned; and an output connected to the input of the last element of the group concerned, the state of said output being equal either to the state of said first input or to the state of said second input as a function of the state of a third input.

9. A memory according to claim 6, wherein said selection circuit comprises at least one two-channel multiplexer.

10. A sequential access memory comprising:

N bistable and synchronous register elements, each storing an information bit, the N elements being divided into P groups each comprising L elements; and a management unit for causing the elements to operate in alternate first and second phases of operation as follows in the first phase of operation whose duration corresponds to P–1 consecutive periods of the clock signal, only last elements of each group are activated simultaneously and are furthermore series-connected, an input of a first of these elements then defining an input of the memory and an output of a last element then defining an output of the memory, and in the second phase of operation whose duration corresponds to a single period of the clock signal, all the elements are activated, the groups of elements being furthermore series-connected, the input of the first element of the first group then defining the input of the memory, and the output of the last element of the last group then defining the output of the memory.

11. A memory according to claim 10, further comprising selection means operatively connected between an output of a second-to-last element and an input of the last element of each group.

12. A memory according to claim 11, wherein said selection means is controlled by the management unit for making the memory operate alternately in the first phase of operation and in the second phase of operation.

13. A memory according to claim 11, wherein said selection means comprises:

a first input connected to the output of the second to last element of the group concerned;

a second input which, for a first group of elements, receives the data elements entering the memory which are furthermore transmitted to the input of the first element of the group and, for the other groups, is connected to the output of the last element of the previous group, this output being furthermore connected to the input of the first element of the group concerned; and an output connected to the input of the last element of the group concerned, the state of said output being equal either to the state of said first input or to the state of said second input as a function of the state of a third input.

14. A memory according to claim 13, wherein said selection means comprises at least one two-channel multiplexer.

15. A method for operating a sequential access memory working at a rate of a clock signal and comprising N bistable and synchronous register elements, each storing an information bit, the N elements being divided into P groups each comprising L elements, the method comprising the steps of:

in a first phase of operation whose duration corresponds to P−1 consecutive periods of the clock signal, only last elements of each group are activated simultaneously and being furthermore series-connected, so that an input of a first of these elements then defines an input of the memory and an output of a last element then defines an output of the memory; and in a second phase of operation whose duration corresponds to a single period of the clock signal, all the elements are activated, the groups of elements being furthermore series-connected, the input of the first element of the first group then defines the input of the memory, and the output of the last element of the last group then defines the output of the memory.

16. A method according to claim 15, further comprising the step of making the memory operate alternately in the first phase of operation and in the second phase of operation.

* * * * *